US012593686B2

(12) United States Patent
Michaud et al.

(10) Patent No.: US 12,593,686 B2
(45) Date of Patent: Mar. 31, 2026

(54) POWER ELECTRONICS MODULE

(71) Applicant: SAFRAN ELECTRICAL & POWER, Blagnac (FR)

(72) Inventors: Benoit Michaud, Blagnac (FR); Julien Marc Nicolas Rambaud, Blagnac (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 412 days.

(21) Appl. No.: 18/546,665

(22) PCT Filed: Feb. 16, 2022

(86) PCT No.: PCT/FR2022/050281
§ 371 (c)(1),
(2) Date: Aug. 16, 2023

(87) PCT Pub. No.: WO2022/175629
PCT Pub. Date: Aug. 25, 2022

(65) Prior Publication Data
US 2024/0136248 A1 Apr. 25, 2024
US 2024/0234236 A9 Jul. 11, 2024

(30) Foreign Application Priority Data

Feb. 18, 2021 (FR) .................................. FR2101570

(51) Int. Cl.
*H01L 23/367* (2006.01)
*H01L 23/00* (2006.01)
(Continued)

(52) U.S. Cl.
CPC ........ *H01L 23/3675* (2013.01); *H01L 23/142* (2013.01); *H01L 23/3735* (2013.01);
(Continued)

(58) Field of Classification Search
CPC . H01L 23/492; H01L 23/3672; H01L 23/142; H01L 23/3735; H01L 23/62;
(Continued)

(56) References Cited

U.S. PATENT DOCUMENTS 11,515,804 B2 11/2022 Poret et al.
11,594,475 B2 2/2023 Khazaka et al.
(Continued)

FOREIGN PATENT DOCUMENTS

FR 3042078 A1 4/2017
FR 3061989 A1 7/2018
(Continued)

OTHER PUBLICATIONS

International Search Report mailed Jul. 7, 2022, issued in corresponding International Application No. PCT/FR2022/050281, filed Feb. 16, 2022, 2 pages.
(Continued)

*Primary Examiner* — Steven B Gauthier
*Assistant Examiner* — Marc-Anthony Armand
(74) *Attorney, Agent, or Firm* — Christensen O'Connor Johnson Kindness PLLC

(57) ABSTRACT

Embodiments of the disclosure relate to a power electronics apparatus. The power electronics apparatus includes at least a first electrically conductive element and a second electrically conductive element. The elements are intended to be at a first electrical potential and at a second electrical potential, respectively. At least a first and second power electronics components are mounted on the first and second elements, respectively, a first portion and a second portion of a sink are mounted on the first conductive element and on the second conductive element, respectively, so as to permit the transfer of heat from each power component to the corresponding portion of the sink through the corresponding conductive
(Continued)

element. An electrical insulator is present between each portion of the sink so as to prevent the risk of flashover between the two portions.

10 Claims, 3 Drawing Sheets

(51) Int. Cl.

| | |
|---|---|
| *H01L 23/14* | (2006.01) |
| *H01L 23/373* | (2006.01) |
| *H01L 25/07* | (2006.01) |
| *H05K 7/20* | (2006.01) |

(52) U.S. Cl.
CPC ............ *H01L 24/48* (2013.01); *H01L 25/072* (2013.01); *H01L 2224/48245* (2013.01); *H01L 2924/13055* (2013.01); *H01L 2924/13091* (2013.01); *H05K 7/209* (2013.01)

(58) Field of Classification Search
CPC . H01L 2224/32225; H01L 2224/32238; H01L 2224/48137; H01L 2224/48472; H01L 2224/73265
See application file for complete search history.

(56) References Cited

U.S. PATENT DOCUMENTS

| | | | |
|---|---|---|---|
| 2002/0185726 A1* | 12/2002 | North | H01L 23/3735 |
| | | | 257/E23.106 |
| 2008/0230890 A1 | 9/2008 | Ueda | |
| 2012/0211213 A1 | 8/2012 | Kitajima | |
| 2013/0003308 A1 | 1/2013 | Stella | |
| 2016/0027709 A1 | 1/2016 | Okamoto | |
| 2016/0315037 A1 | 10/2016 | Kadoguchi et al. | |
| 2020/0176348 A1* | 6/2020 | Lim | H01L 23/5384 |
| 2020/0357717 A1* | 11/2020 | Maier | H01L 23/3675 |

FOREIGN PATENT DOCUMENTS

| | | |
|---|---|---|
| FR | 3084960 A1 | 2/2020 |
| JP | 2000091481 A | 3/2000 |

OTHER PUBLICATIONS

Written Opinion of the International Searching Authority mailed Jul. 7, 2022, issued in corresponding International Application No. PCT/FR2022/050281, filed Feb. 16, 2022, 7 pages.

Rapport De Recherche Préliminaire / Opinion Écrite Sur La Brevetabilité De L'invention dated Nov. 26, 2021, issued in corresponding French Application No. 2101570, filed Feb. 18, 2021, 9 pages.

* cited by examiner

POWER ELECTRONICS MODULE

TECHNICAL FIELD OF THE INVENTION

The invention relates to a power electronics module intended to equip, for example, a power converter of a control box, in particular for control actuators, AC/DC or DC/DC converters, fans, electrical generation machines or propulsion machines.

PRIOR ART

FIG. 1 illustrates a power electronics module 1 known from the prior art. The latter includes power semiconductor components 2, the heat produced in the operation of which is evacuated via a heatsink 4 comprising fins 5. The calories produced at the components 2 pass successively, from the components 2 up to the heatsink 4, through an interconnection joint 6, a first metallic layer 7, an electrically-insulating layer 8 made of a ceramic material, a second metallic layer 9, an interconnection joint 10, a metal sole 11 and a thermal interface 12 such as a thermal grease. The module 1 also includes a case 13 fastened to the first metallic layer 7 by means of a glue 14, connectors 15, wiring wires 16 and an encapsulating material 17. The ceramic insulating layer 8 and the thermal interface 12 have a relatively high thermal resistance, which limits the capacity of evacuating calories towards the heatsink 4.

In order to overcome this drawback in part and as illustrated in FIG. 2, the document FR 3 061 989 discloses a power electronics module 1 for which the heat is evacuated from the power semiconductor components 2 towards the heatsink 4 by passing successively through an interconnection joint 6, formed for example by a solder 6, a first stack of successive thermomechanical transition layers 18, a first metallic layer 19, an insulating layer made of a ceramic material 20, a second metallic layer 21 and a second stack of successive thermomechanical transition layers 22. The transition layers 18, 22 are made of different materials, having coefficients of thermal expansion decreasing when getting away from the insulating layer made of ceramic 20, which allows limiting the camber effect according to temperature.

Such an embodiment does not have a thermal interface, the heatsink 4 forming one of the layers of the second stack 22, namely the layer the farthest from the ceramic insulating layer 20, which allows improving the evacuation of heat derived from the power components 2 towards the heatsink 4.

However, the presence of an insulating layer made of a ceramic material 20 continues to generate a thermal resistance affecting the evacuation of calories.

As illustrated in FIG. 3, the document FR 3 084 960 proposes a power module 1 including power components 2 mounted on conductive layers 23, 24, 25, for example made of copper, said conductive layers 23, 24, 25, 26 including bosses 23a, 24a, 25a, 26a extending perpendicularly to the planes of said layers 23, 24, 25, 26 and allowing connecting the components 2 to the heatsink 4, via a thermal paste 27 also acting as an electrical insulator. Such an embodiment allows improving the transfer of calories in the direction of the heatsink 4, although such a transfer remains affected by the thermal resistance of the paste layer 27.

SUMMARY OF THE INVENTION

The invention aims to improve such heat transfer while ensuring satisfactory electrical insulation between the different electrical potentials of the module, in a simple, reliable and inexpensive manner.

To this end, the invention relates to a power electronics module including a first electrically-conductive element and a second electrically-conductive element, intended to be respectively at a first electrical potential and at a second electrical potential, at least first and second power electronics components being respectively mounted on the first and second elements, a first portion and a second portion of a heatsink being respectively mounted on the first conductive element and on the second conductive element so as to enable the transfer of calories from each power component towards the corresponding portion of the heatsink throughout the corresponding conductive element, said portions of the heatsink including a first end located on the side of said elements and a second end, opposite to the first end, the first conductive element and the first portion of the heatsink being electrically insulated from the second element and from the second portion of the heatsink, via at least one electrical insulator, each portion of the heatsink including a lateral face oriented in the direction of the other portion of the heatsink, the electrical insulator being accommodated between said lateral faces of said portions of the heatsink, said lateral faces diverging from each other in the direction of the second end.

In operation, heat is produced by the power components, the calories being evacuated by the first and second portions of the heatsink throughout the first and second elements which are made of an electrically and thermally conductive material, without passing through a layer having a high thermal resistance, which allows improving the evacuation of calories. In order to avoid a short circuit, the first element and the first portion of the heatsink are electrically insulated from the second element and from the second portion of the heatsink. The insulator may be a single insulator or several insulators, for example made of different materials. The fact that the lateral faces of the two portions of the heatsink diverge from each other allows increasing the distance between these two lateral faces in the direction of the second end, so as to avoid the risk of electric arcs between the two portions in the cooling fluid, which may be for example air or oil. Indeed, such an electric arc could occur given the high potential differences between the two portions of the heatsink. Such potential differences may be in the range of several hundred Volts. The flared shape of the lateral faces then allows bringing away the non-insulated potentials and increasing the distance of travel between the two portions of the heatsink having different potentials.

The flared shape of the lateral faces also allows facilitating the insertion of resin between said faces.

The heatsink is able to exchange heat with a cooling fluid, for example air, in particular filtered air or a heat-transfer fluid such as oil.

For example, the first element and the second element are made of copper. For example, the portions of the heatsink are made of aluminium.

For example, the power components are components of the transistor or diode type, for example components of the MOSFET or IGBT type.

The invention also relates to a third conductive element, intended to be at a third electrical potential and electrically insulated from the first and second conductors, the third element having no power electronics component and being separate from the heatsink. Such a configuration allows making a module of the bridge arm or half-bridge type commonly used in most power converters.

The second electric potential may vary and may be equal to the first electric potential or to the third electric potential.

The third element is not intended to conduct heat to the heatsink since the latter does not support a power component. Hence, the third element may be placed at a distance from the heatsink.

Wiring wires may provide electrical connections between the components and/or the different aforementioned elements.

The power electronics module may also include connectors connected to the different elements.

Each first and second element may be connected to the corresponding portion of the heatsink via a stack of at least two thermomechanical transition layers, made of different materials within the same stack and having coefficients of thermal expansion increasing in the direction of the corresponding portion of the heatsink.

Such a stack of transition layers allows limiting the camber effect according to temperature, without substantially impacting the transfer of calories towards the heatsink. The transition layers do not act as an electrical insulator or conductive insulator.

The transition layers may be made of materials identical or similar to those described in the document FR 3 061 989.

The electrical insulator which may be accommodated between said lateral faces of said portions of the heatsink is an epoxy resin, for example a resin of the ER2223 or ER2225 type.

The electrical insulator located between the two elements may be different from that one located between the two portions of the heatsink. The electrical insulator located between the two elements may be an FR4 type insulator, for example an insulator commonly used for the manufacture of printed circuits.

The power electronics module may include a first layer of an electrically-conductive material forming the third element and a second layer of an electrically-conductive material, forming the first and second elements, the second layer being interposed between the first layer and the heatsink, the second layer including bosses passing through the first layer, the power components being mounted on said bosses, an electrical insulator being located between the first layer and the second layer and between the first and second elements of the second layer.

The superposition of the first and second layers allows achieving a mutual effect between the conductive elements and thus reducing the loop inductance in the case of use of components forming a Diode-MOSFET type switching cell for example.

Moreover, the second layer may take advantage of a large exchange surface to ensure cooling.

Each portion of the heatsink may include fins, each lateral face being formed at least partially on a fin. Each portion of the heatsink may also include spikes.

The presence of fins or spikes allows increasing the exchange surfaces in contact with the cooling fluid, so as to improve heat exchange and the evacuation of calories.

Each lateral surface may be planar or rounded. In the case of planar lateral surfaces, the angle between the surfaces may be comprised between 45 and 75°.

The distance between the second ends of the lateral faces of the two portions of the heatsink may be comprised between 3 and 15 mm.

The second ends are also called the free ends of the portions of the heatsink.

For example, this distance is comprised between 3 and 8 mm, for example in the range of 5 mm when the cooling fluid is oil.

For example, this distance is comprised between 8 and 15 mm, for example in the range of 11 mm when the cooling fluid is air, in particular filtered air.

The length and the width of the fins or the length and the diameter of the spikes may also vary according to the amount of heat to be dissipated and the flow rate or the nature of the cooling fluid.

The heatsink may be made by additive manufacturing.

The power electronics module may be of the bridge arm type.

The invention also relates to a turbine engine including a power electronics module of the aforementioned type.

DETAILED DESCRIPTION OF THE INVENTION

Figure 1:
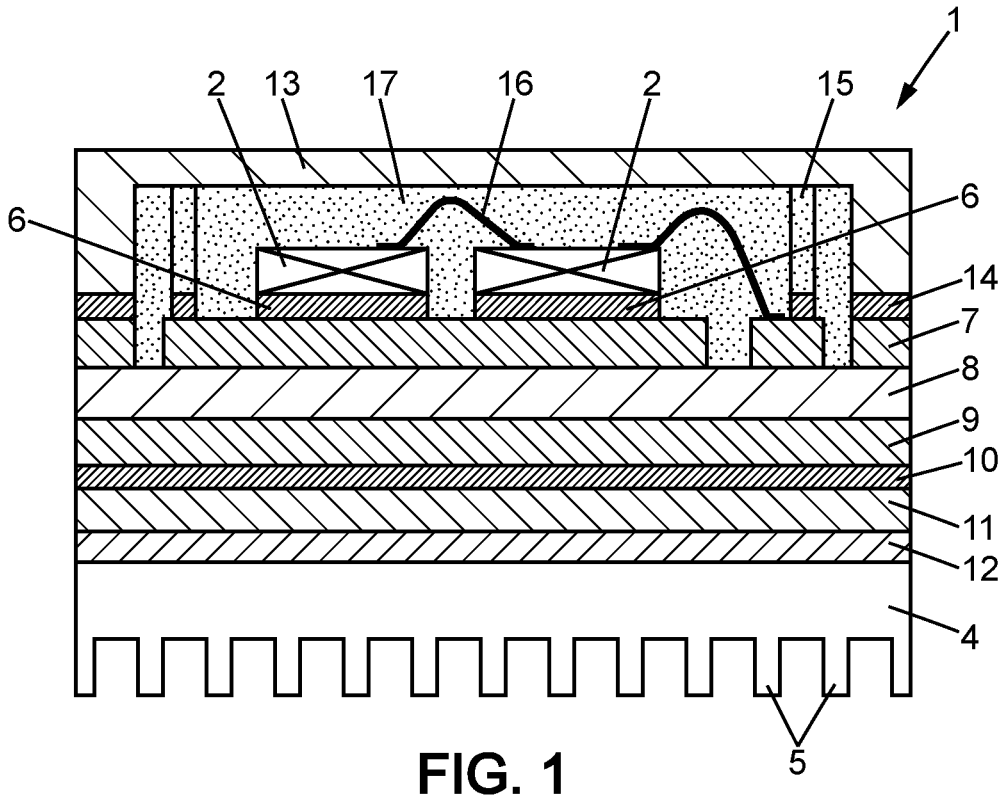
FIG. 1 is a schematic sectional view of a power electronics module according to a first embodiment of the prior art.
Figure 2:
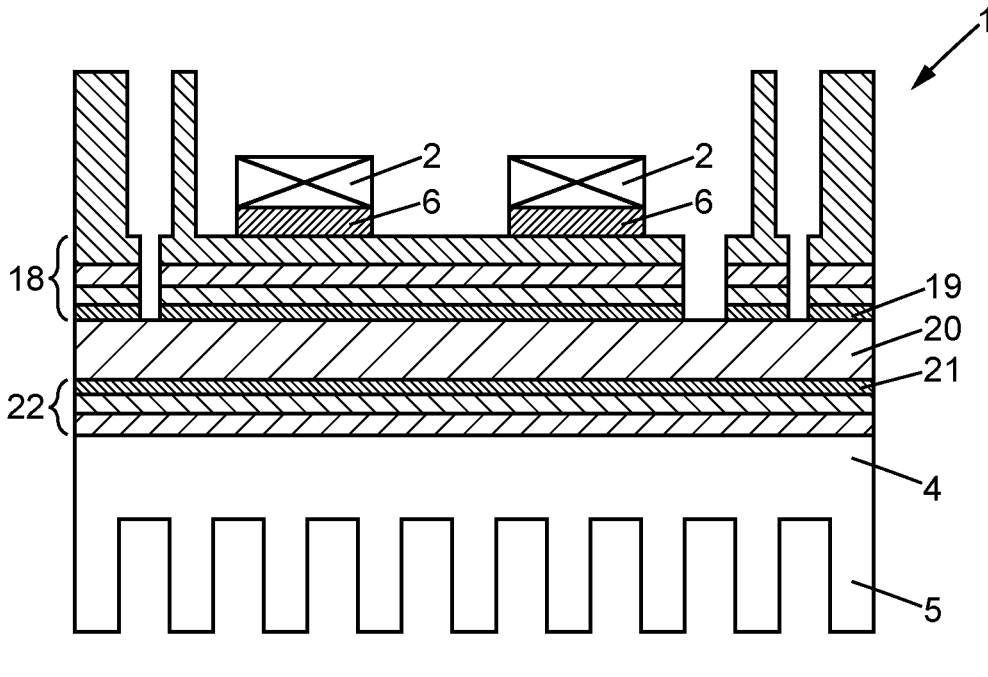
FIG. 2 is a schematic sectional view of a power electronics module according to a second embodiment of the prior art.
Figure 3:
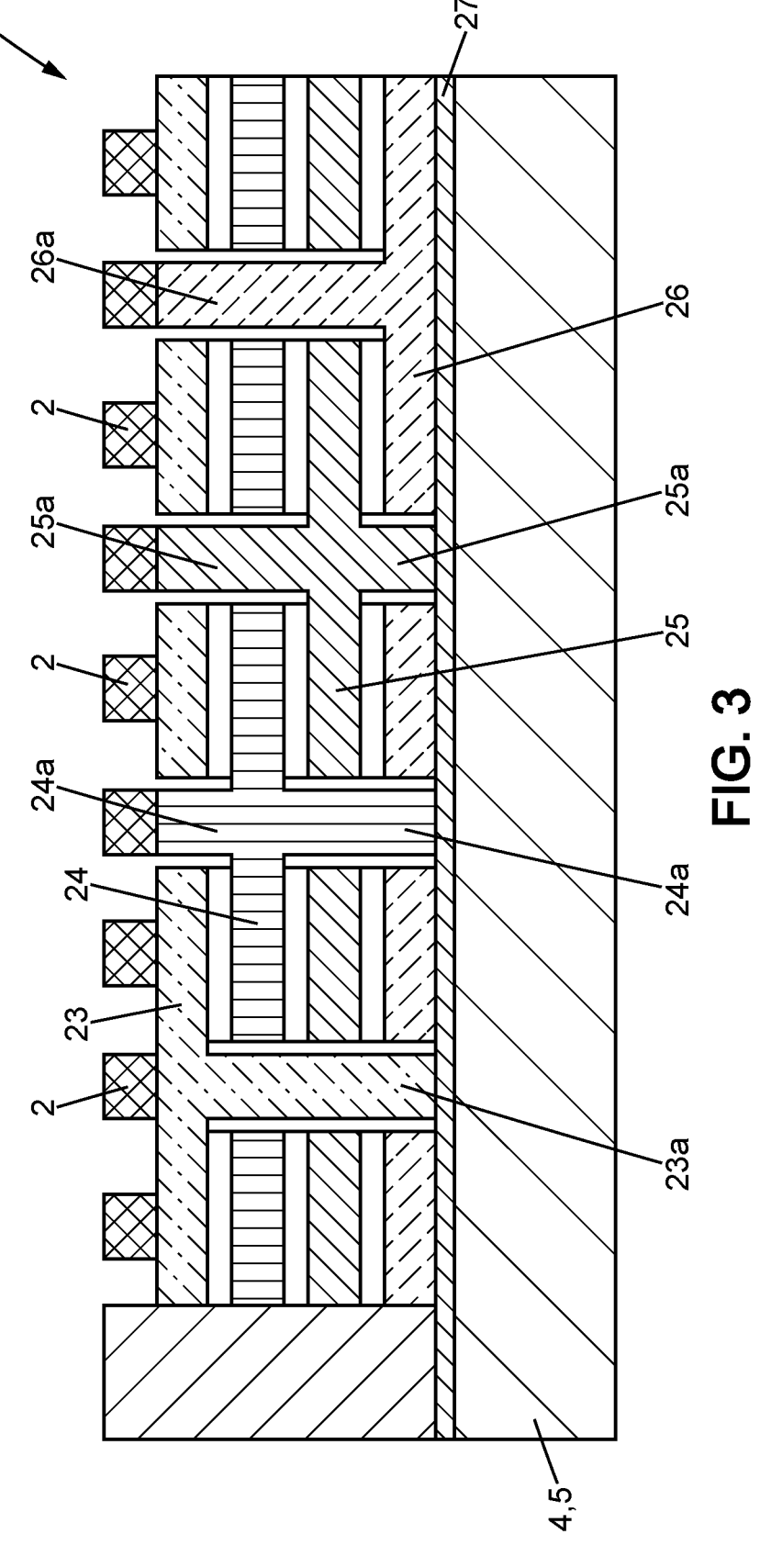
FIG. 3 is a schematic sectional view of a power electronics module according to a third embodiment of the prior art.
Figures 4, 5:
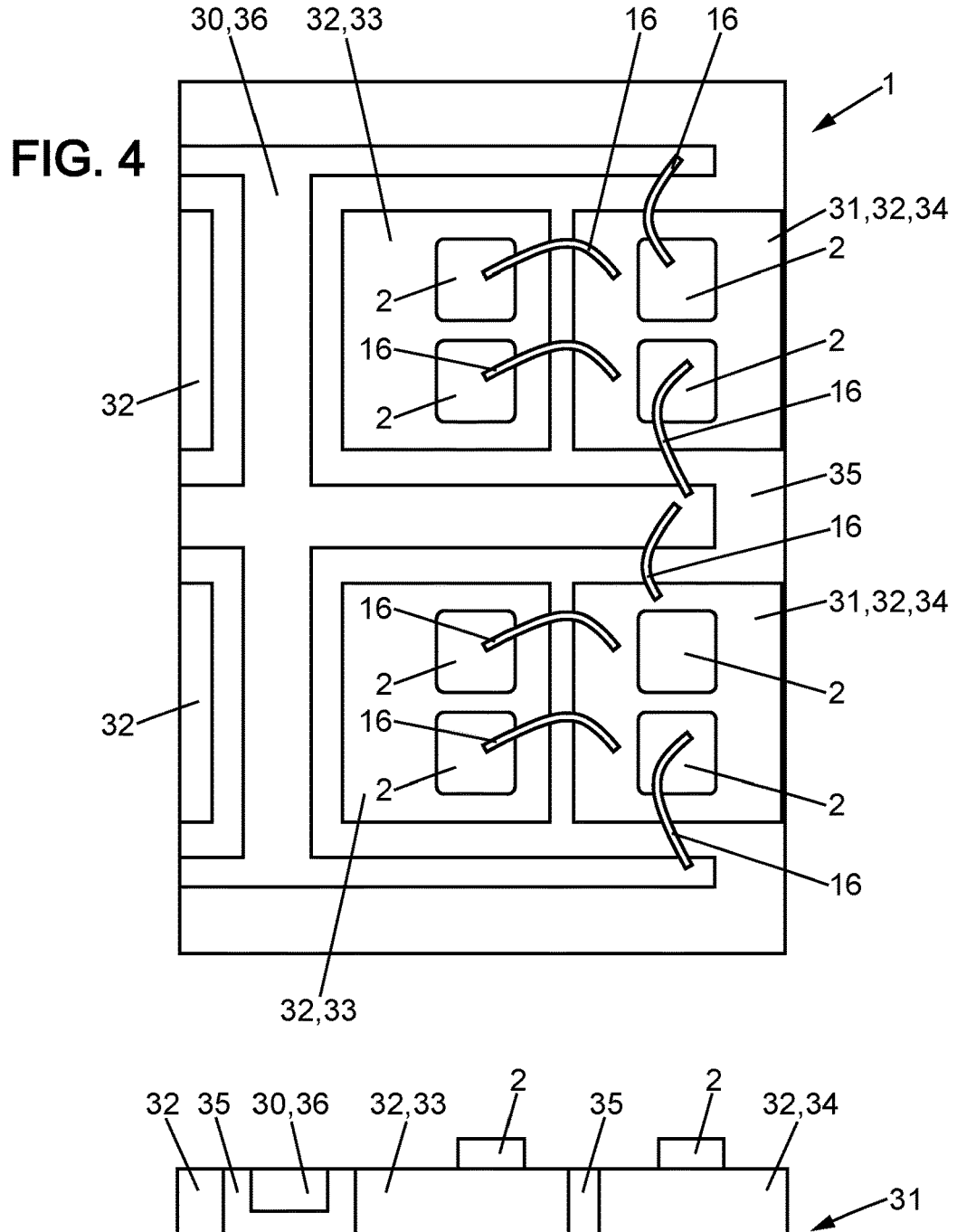
FIG. 4 is a schematic top view of a power electronics module according to a first embodiment of the invention.
FIG. 5 is a schematic sectional view of the power electronics module of FIG. 4.

FIGS. 4 and 5 illustrate a power electronics module 1 including first and second layers 30, 31 of an electrically-conductive material, for example copper.

The second layer 31 includes bosses 32 passing through the first layer 30, semiconductor power electronics components 2 being mounted on said bosses 32.

The second layer 32 includes at least two tracks or electrically-conductive elements, respectively a first element 33 and a second element 34, separated from each other by an electrically-insulating material 35.

The first layer 30 forms a third track or electrically-conductive element 36. The first layer 30 is also separated from the second layer 31 by the electrically-insulating material 35.

For example, the first element 33 is at an electric potential denoted +DC, for example in the range of 800 V. The second element 34 forms a phase whose potential may vary and be for example at 800 V or at 0 V. For example, the third element 36 is at an electric potential denoted −DC, for example in the range of 0 V.

Wiring wires 16 ensure electrical connections between the components 2 and/or the different elements 33, 34, 36 mentioned before. The power electronics module 1 may also include connectors, not shown, connected to the different elements 33, 34, 35.

For example, the power components 2 are formed by transistors or diodes, for example components of the MOSFET or IGBT type. These components 2 release heat in operation, which should be evacuated.

For this purpose, the module 1 includes a heatsink 4, for example made of aluminium, including a first portion 4a and a second portion 4b separated from each other by an insulating material 37, which herein is a material different from the insulating material 35 separating the different elements. The insulating material 37 is for example an epoxy resin whereas the insulating material 35 is for example an FR4 type insulator, such as an insulator commonly used for the manufacture of printed circuits.

Each portion 4a, 4b of the heatsink 4 includes a base 4c from which fins 5 intended to exchange heat with a cooling fluid extend.

The base 4c of the first portion 4a includes a planar surface forming a first end 38, connected to the first element 33, via a first stack 40 of thermomechanical transition layers. Similarly, the base 4c of the second portion 4b includes a planar surface forming a first end 38, connected to the second element 34, via a second stack 41 of thermomechanical transition layers. The free ends of the fins form the second ends 39 of the portions 4a, 4b of the heatsink 4.

Each stack of layers 40, 41 includes at least two layers, made of different materials within the same stack and having thermal expansion coefficients increasing in the direction of the corresponding portion 4a, 4b of the heatsink 4.

Such a stack of transition layers 40, 41 allows limiting the camber effect according to temperature, without substantially impacting the transfer of calories towards the heatsink 4. The transition layers do not act as an electrical insulator or conductive insulator.

The transition layers may be made of materials identical or similar to those described in the document FR 3 061 989.

The two stacks of layers 40, 41 are separated from each other by the insulating material 37. As shown in FIG. 5, each portion 4a, 4b of the heatsink 4 includes a planar lateral face 42 oriented in the direction of the other portion 4b, 4a of the heatsink 4, said lateral faces 42 diverging from each other in the direction of the second end 39.

The distance d between the second ends 39 of the lateral faces 42 of the two portions 4a, 4b of the heatsink 4 is comprised between 3 and 15 mm.

For example, this distance d is comprised between 3 and 8 mm, for example in the range of 5 mm when the cooling fluid is oil.

For example, this distance d is comprised between 8 and 15 mm, for example in the range of 11 mm when the cooling fluid is air, in particular filtered air.

In operation, heat is produced by the power components, the calories being evacuated by the first and second portions of the heatsink 4 throughout the first and second elements 33, 34 and the stacks of transition layers 40, 41. The presence of the thermal insulators 35, 37 ensures electrical insulation between the different potentials of the module 1. Moreover, the fact that the lateral faces 42 of the two portions 4a, 4b of the heatsink 4 diverge from each other allows increasing the distance between these two lateral faces 42 in the direction of the second end 39, so as to avoid the risk of electric arcs between the two portions 4a, 4b through the cooling fluid. Indeed, in the absence of such a structure, an electric arc could occur given the high potential differences between the two portions 4a, 4b of the heatsink 4.

The invention claimed is:

1. A power electronics apparatus, comprising:
a first electrically-conductive element and a second electrically-conductive element, intended to be respectively at a first electrical potential and at a second electrical potential;

a first power electronics component and a second power electronics component being respectively mounted on the first and second elements; and
a first portion and a second portion of a heatsink being respectively mounted on the first conductive element and on the second conductive element so as to enable the transfer of calories from each power component towards the corresponding portion of the heatsink throughout the corresponding conductive element, said portions of the heatsink including a first end located on the side of said elements and a second end, opposite to the first end, the first conductive element and the first portion of the heatsink being electrically insulated from the second element and from the second portion of the heatsink, via an electrical insulator,
wherein each portion of the heatsink includes a lateral face oriented in the direction of the other portion of the heatsink, the electrical insulator being accommodated between said lateral faces of said portions of the heatsink, said lateral faces diverging from each other in the direction of the second end.

2. The power electronics apparatus according claim 1, further comprising a third conductive element, intended to be at a third electric potential and electrically insulated from the first and second conductors, the third conductive element having no power electronics components and being separate from the heatsink.

3. The power electronics apparatus according to claim 1, wherein each first conductive element and second conductive element are connected to the corresponding portion of the heatsink via a stack of at least two thermomechanical transition layers, said layers made of different materials within the same stack and having thermal expansion coefficients increasing in the direction of the corresponding portion of the heatsink.

4. The power electronics apparatus according to claim 2, comprising a first layer of an electrically-conductive material forming the third conductive element and a second layer of an electrically-conductive material, forming the first and second elements, the second layer being interposed between the first layer and the heatsink, the second layer including bosses passing through the first layer, the power components being mounted on said bosses, an electrical insulator being located between the first layer and the second layer and between the first and second conductive elements of the second layer.

5. The power electronics apparatus according to claim 1, wherein the electrical insulator accommodated between said lateral faces of said portions of the heatsink includes an epoxy resin.

6. The power electronics apparatus according to claim 1, wherein each portion of the heatsink includes fins, each lateral face being formed at least partially on a fin.

7. The power electronics apparatus according to claim 1, wherein each lateral face is planar or rounded.

8. The power electronics apparatus according to claim 1, wherein a distance between the second ends of the lateral faces of the two portions of the heatsink is in the range of between 3 mm and 15 mm.

9. The power electronics apparatus according to claim 1, wherein said apparatus is of the bridge arm type.

10. A turbine engine including a power electronics apparatus according to claim 1.

* * * * *